(12) United States Patent
Cai

(10) Patent No.: US 10,312,072 B2
(45) Date of Patent: Jun. 4, 2019

(54) STRUCTURE FOR FINFET DEVICES

(71) Applicant: Taiwan Semiconductor Manufacturing Co., Ltd., Hsin-Chu (TW)

(72) Inventor: Jin Cai, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/045,576

(22) Filed: Jul. 25, 2018

(65) Prior Publication Data

US 2018/0350586 A1 Dec. 6, 2018

Related U.S. Application Data

(62) Division of application No. 15/609,775, filed on May 31, 2017, now Pat. No. 10,163,621.

(51) Int. Cl.
*H01G 4/018* (2006.01)
*H01L 21/02* (2006.01)
*H01L 33/00* (2010.01)
*H01L 27/088* (2006.01)
*H01L 29/02* (2006.01)

(52) U.S. Cl.
CPC ....... *H01L 21/02019* (2013.01); *H01G 4/018* (2013.01); *H01L 27/0886* (2013.01); *H01L 33/0041* (2013.01)

(58) Field of Classification Search
CPC .............. H01L 29/1083; H01L 29/0847
USPC ....... 257/347, 400, 345, 389, 386, 394, 396, 257/397, 398; 438/197, 289, 199, 283, 438/284
See application file for complete search history.

(56) References Cited

U.S. PATENT DOCUMENTS

| | | | |
|---|---|---|---|
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |

(Continued)

OTHER PUBLICATIONS

Saint-Cast, Pierre at al., "Very Low Surface Recombination Velocity on P-Type c-Si by High-Rate Plasma-Deposited Aluminum Oxide", 2009, 3 pages, vol. 95.15, Applied Physics Letters Journal, American Institute of Physics.

(Continued)

*Primary Examiner* — Nduka E Ojeh
(74) *Attorney, Agent, or Firm* — Haynes and Boone, LLP

(57) ABSTRACT

A semiconductor device and a method of forming the same are disclosed. The semiconductor device includes a semiconductor substrate; a fin extending from the semiconductor substrate; a first charged dielectric layer covering a bottom portion of the fin, the first charged dielectric layer having net fixed first-type charges; a second charged dielectric layer covering the first charged dielectric layer, the second charged dielectric layer having net fixed second-type charges, the second-type charges being opposite to the first-type charges; and a gate structure engaging a top portion of the fin.

20 Claims, 17 Drawing Sheets

(56) References Cited

U.S. PATENT DOCUMENTS

| | | |
|---|---|---|
| 9,576,814 B2 | 2/2017 | Wu et al. |
| 2014/0367795 A1* | 12/2014 | Cai .................... H01L 27/0886 |
| | | 257/392 |
| 2015/0372144 A1 | 12/2015 | Fang et al. |
| 2016/0126141 A1 | 5/2016 | Kim et al. |
| 2017/0053825 A1* | 2/2017 | Seo .................. H01L 21/31144 |
| 2017/0062280 A1 | 3/2017 | Li |
| 2017/0133378 A1* | 5/2017 | Zhu ................ H01L 21/823821 |
| 2018/0061717 A1* | 3/2018 | Wang ............. H01L 21/823878 |

OTHER PUBLICATIONS

Chen, Kevin et al., "Air Stable n-Doping of WSe2 by Silicon Nitride Thin Films with Tunable Fixed Charge Density", 2014, 7 pages, vol. 2.9, APL Materials.

Hezel, R., "Very High Charge Densities in Silicon Nitride Films on Silicon for Inversion Layer Solar Cells", 1981, 5 pages, In: Schulz M.J., Pensl G. (eds) Insulating Films on Semiconductors. Springer Series in Electrophysics, vol. 7. Springer, Berlin, Heidelberg.

* cited by examiner

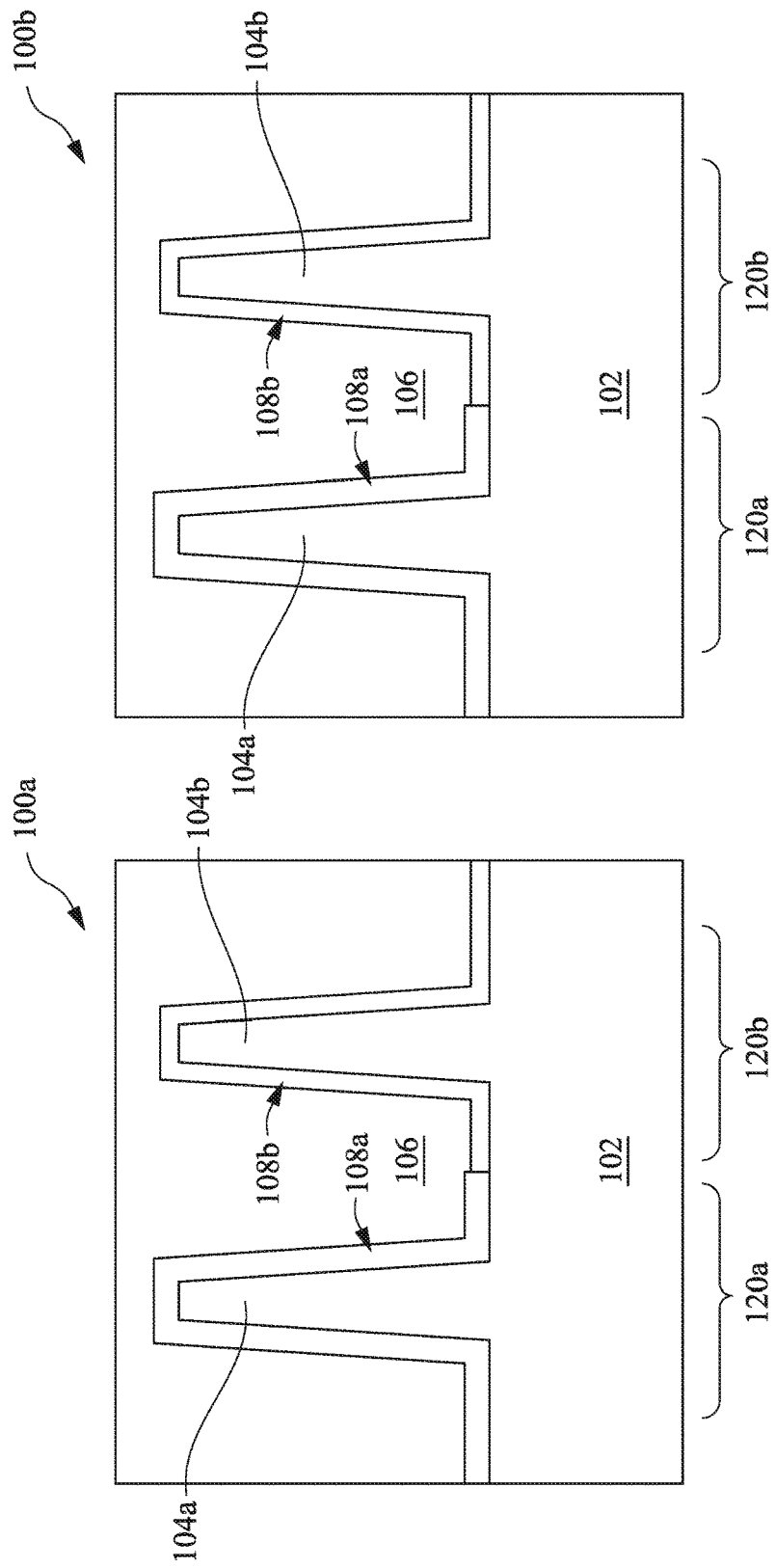

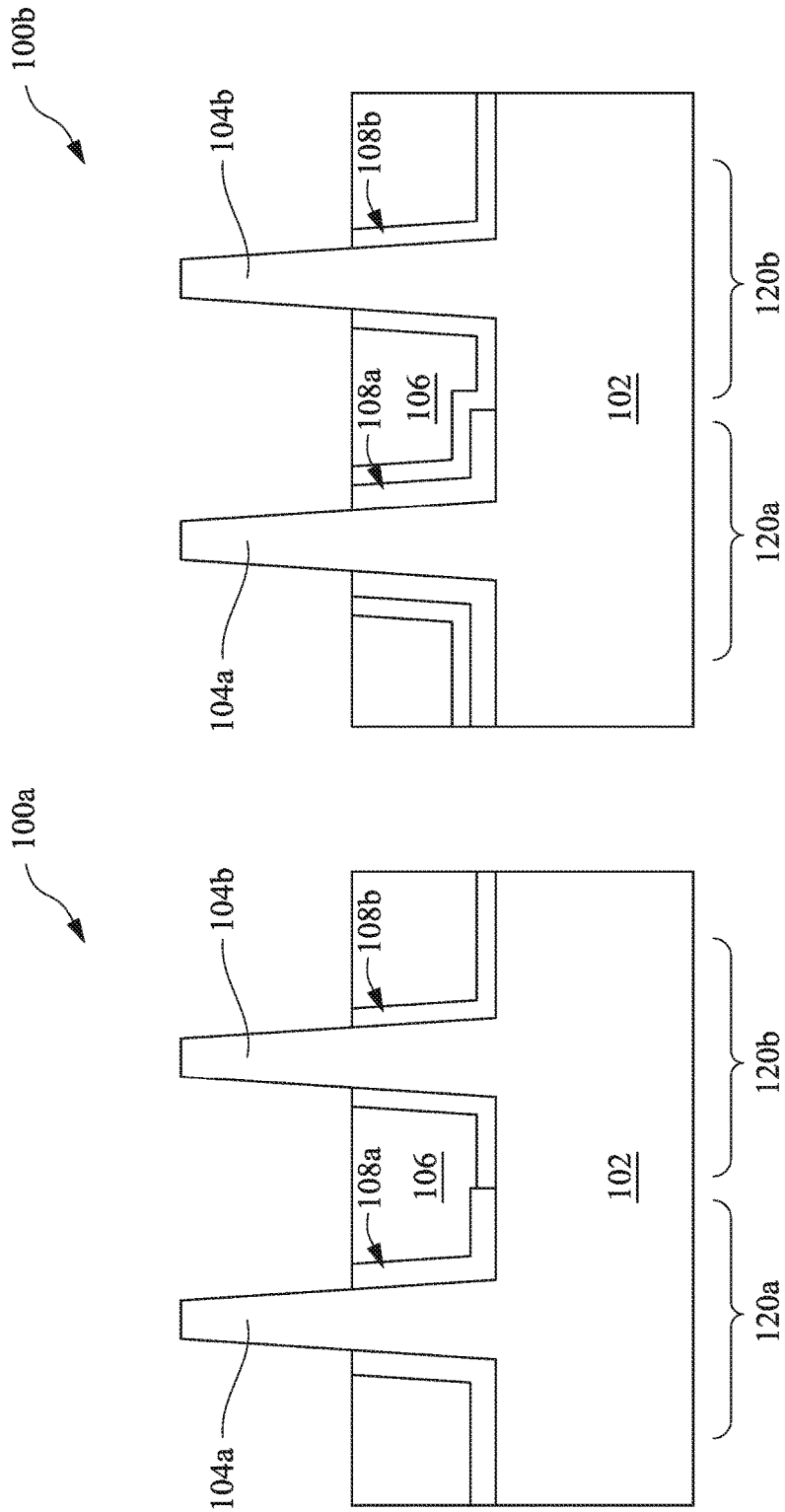

STRUCTURE FOR FINFET DEVICES

PRIORITY

This is a divisional of U.S. patent application Ser. No. 15/609,775, filed May 31, 2017, herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, field effect transistors (FETs) such as fin field effect transistors (FinFETs) have been developed for their high drive currents with small footprints compared to traditional planar FETs. In one method, FinFETs are formed on bulk substrate for reduced manufacturing cost. However, typical bulk FinFETs suffer a punch-through issue where leakage currents may flow in a region not controlled by a gate. To overcome the punch-through issue, conventional methods implant dopant impurities into regions between the fin channel and the bulk substrate. Thermal treatments in subsequent process steps may cause diffusion of the implanted dopant impurities. These methods unavoidably introduce dopant impurities into the whole fin, adversely reducing the carrier mobility thereof. In addition, dopant impurity implantation may also adversely affect channel strain of the fin. Therefore, although conventional punch-through mitigating methods have been generally adequate for their intended purposes, they are not satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A, 3B, 3C, 3D, 3E, 3F, 3G, and 3H are cross sectional views of forming a semiconductor device according to the method of FIG. 2, in accordance with some embodiments.

DETAILED DESCRIPTION

Figure 1A:
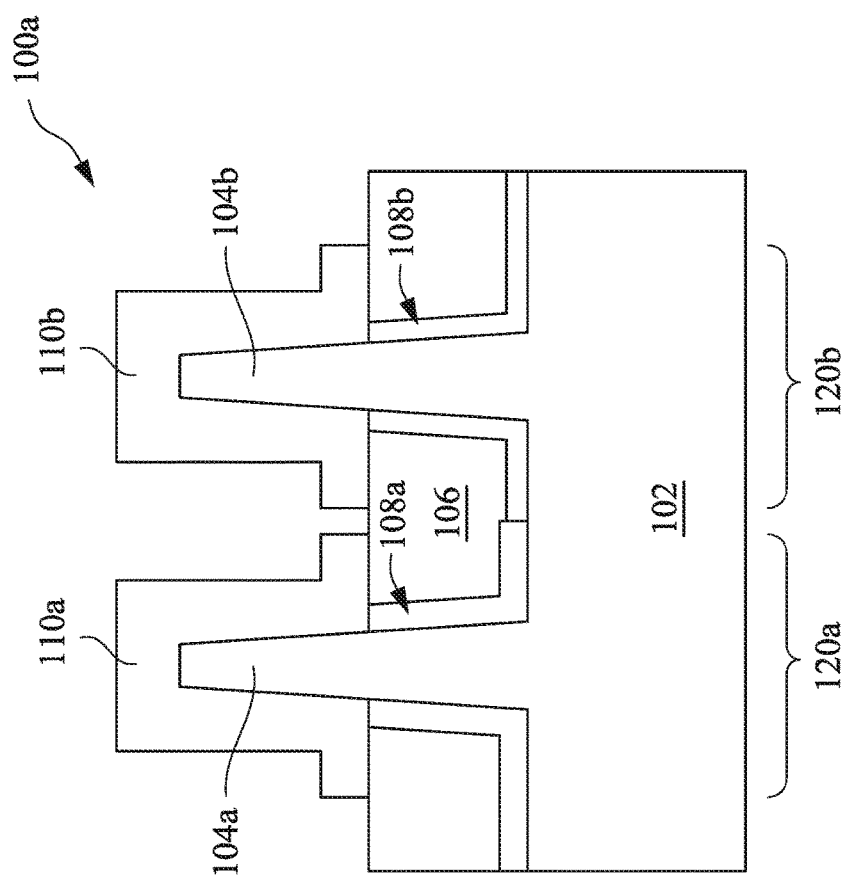
FIGS. 1A, 1B, and 1C illustrate cross-sectional views of a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices, and more particularly to semiconductor devices having field effect transistors (FETs) such as fin field effect transistors (FinFETs). It is an objective of the present disclosure to provide methods for and structures of semiconductor devices that effectively overcome punch-through issues in FETs while providing excellent carrier mobility and high short channel effect control.

Figure 1B:
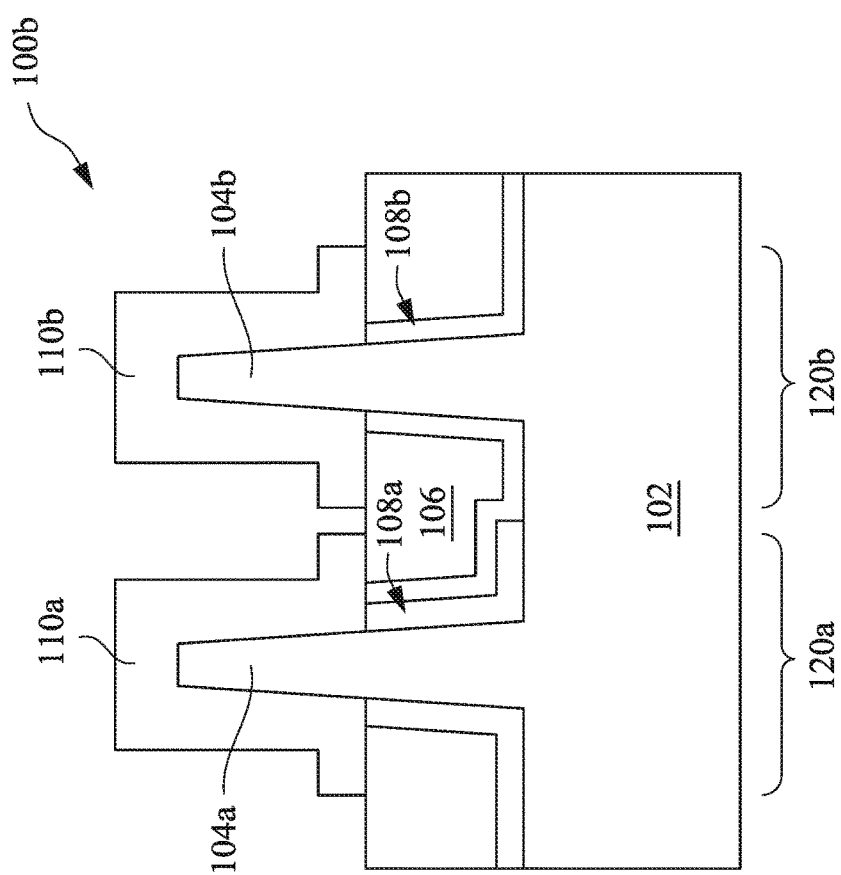
Figure 1C:
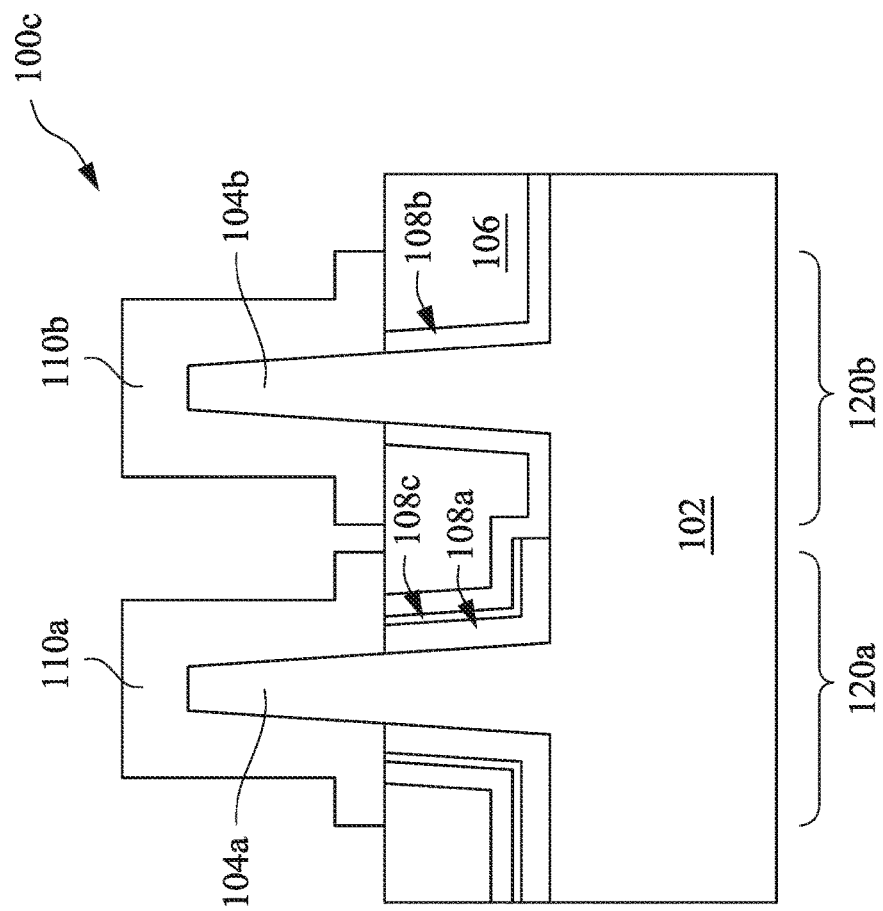

FIGS. 1A, 1B, and 1C show cross-sectional views of different embodiments of a semiconductor device 100 (e.g., the devices 100a, 100b, and 100c) constructed according to various aspects of the present disclosure. As will be shown, the device 100 illustrates an n-type FinFET and a p-type FinFET in one region of a substrate. This is provided for simplification and ease of understanding and does not necessarily limit the embodiment to any number of devices, any number of regions, or any configurations of regions. Furthermore, the FinFET device 100 may be an intermediate device fabricated during processing of an integrated circuit (IC), or a portion thereof, that may comprise static random access memory (SRAM) and/or other logic circuits, passive components such as resistors, capacitors, and inductors, and active components such as p-type FETs, n-type FETs, double gate FETs, tri-gate FETs, FinFETs, metal-oxide semiconductor field effect transistors (MOSFET), complementary metal-oxide semiconductor (CMOS) transistors, bipolar transistors, high voltage transistors, high frequency transistors, other memory cells, and combinations thereof.

Referring to FIG. 1A, the device 100a includes a substrate 102 and an isolation structure 106 over the substrate 102. In the present embodiment, the device 100a includes an n-type FinFET 120a and a p-type FinFET 120b formed over the substrate 102. The FinFETs 120a and 120b have similar structures and will be described collectively below. The FinFET 120a (120b) includes a fin 104a (104b) projecting from the substrate 102 upwardly through the isolation structure 106. The FinFET 120a (120b) further includes a gate structure 110a (110b) over the isolation structure 106 and engaging the fin 104a (104b) on three sides thereof (top surface and sidewalls). In some embodiments, the gate structure 110a (110b) may engage the respective fins on only two sides, e.g., only the sidewalls of the fins. The FinFET 120a (120b) further includes a dielectric layer 108a (108b) with net fixed charges between the fin 104a (104b) and the isolation structure 106. The various elements of the device 100a will be further described in the following sections.

The substrate 102 is a silicon substrate in the present embodiment. Alternatively, the substrate 102 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The isolation structure 106 may be formed of silicon oxide, fluoride-doped silicate glass (FSG), a low-k dielectric material, and/or other suitable insulating material. The isolation structure 106 may be shallow trench isolation (STI) features. Other isolation structures are possible. The isolation structure 106 may include a multi-layer structure, for example, having one or more thermal oxide liner layers.

In various embodiments, each of the gate structure 110a and 110b includes a gate stack. Each gate stack may include a dielectric layer and a gate electrode layer on the gate dielectric layer. The gate dielectric layer includes a dielectric material, such as silicon oxide, germanium oxide, high k dielectric material layer or a combination thereof. In another embodiment, the gate dielectric layer includes an interfacial layer (such as a silicon oxide or germanium oxide layer) and a high k dielectric material layer on the interfacial layer. The gate electrode layer includes a conductive material layer, such as doped polycrystalline silicon (polysilicon), metal, metal alloy or combinations thereof. The gate stack may be formed by a procedure that includes forming a gate dielectric layer, forming a gate electrode layer on the gate dielectric layer, and patterning the gate electrode layer and the gate dielectric layer. The formation of the gate stack may further include a gate replacement procedure to replace the previously formed gate stack with high k dielectric and metal. The gate replacement may include a gate last operation or a high k last operation where both gate dielectric and gate electrode are replaced at a later fabrication stage. Various other embodiments of the gate stacks are possible. Each of the gate structure 110a and 110b may also include gate spacers formed on sidewalls of the gate stack by a procedure that includes deposition and anisotropic etch.

The gate structure 110a (110b) engages a portion of the fin 104a (104b) above the isolation structure 106, which defines a channel region underlying the gate structure 110a (110b). In an exemplary mode of operation of the FinFET 120a (120b), currents may flow between two source/drain regions (not shown) through the channel region under the control of the gate structure 110a (110b) by applying a voltage thereto.

In the present embodiment, the fins 104a and 104b are formed through a variety of processes including photolithography and etching. The fin 104a (104b) is divided into at least two vertical portions (or sections), one above the isolation structure 106 and another one surrounded by the dielectric layer 108a (108b) and the isolation structure 106. In various embodiments, only the fin portions above the isolation structure 106 are under the direct control of the respective gate structures 110a and 110b. The lower portion of the fins surrounded by the isolation structure 106 and a portion of the substrate 102 thereunder are not under the direct control of the gate structures 110a and 110b, which defines sub-fin regions of the respective FinFETs. In a conventional FinFET, currents might flow in sub-fin regions not under the direct control of a gate, causing punch-through. This is undesirable. The FinFETs 120a and 120b overcome such issue.

Still referring to FIG. 1A, the dielectric layer 108a (108b) is located between the isolation structure 106 and the fin 104a (104b). The dielectric layer 108a (108b) is conformal to the profile of the fin 104a (104b), therefore also referred to as the liner film 108a (108b). The liner film 108a (108b) includes net fixed charges. In the present embodiment, the FinFET 120a is an n-type FinFET with a p-type doped channel region and the liner film 108a includes net negative fixed charges. The sheet charge carrier density in the liner film 108a is sufficiently high so as to repel the flowing of electrons into the sub-fin regions, thereby stopping punch-through currents between the sub-fin regions. To further this embodiment, the liner film 108a is an aluminum oxide (AlOx) dielectric layer with a presence of negative fixed charge sheet density of about $2 \times 10^{11}/cm^2$ to about $1 \times 10^{13}/cm^2$. In various embodiments, the liner film 108a has a thickness of about 1 nm to about 5 nm.

In the present embodiment, the FinFET 120b is a p-type FinFET with an n-type doped channel region and the liner film 108b includes net positive fixed charges. The sheet charge carrier density in the liner film 108b is sufficiently high so as to repel the flowing of holes into the sub-fin regions, thereby stopping punch-through currents between the sub-fin regions. To further this embodiment, the liner film 108b is a silicon nitride ($SiN_x$) dielectric layer with a presence of positive fixed charge sheet density of about $2 \times 10^{11}/cm^2$ to about $1 \times 10^{13}/cm^2$. The liner film 108b has a thickness of about 1 nm to about 5 nm. In various embodiments, the sheet charge carrier densities in the liner films 108a and 108b are different. For example, the liner film with positive fixed charges has less sheet charge carrier density than the liner film with negative fixed charges, or vice versa, as will be described further in details later.

FIGS. 1B and 1C illustrate cross-sectional views of the semiconductor device 100 in some other embodiments. These other embodiments are similar to the semiconductor device 100a. Therefore, reference numerals for the device 100a are repeated to show the same or similar features in the devices 100b and 100c, respectively. Furthermore, some descriptions of the same or similar features are abbreviated or omitted by referring to the descriptions of the device 100a for the sake of simplicity.

As shown in FIG. 1B, the liner film 108b extends to the FinFET 120a and covers the liner film 108a. In the present embodiment, the FinFET 120a is an n-type FinFET with a p-type doped channel region and the liner film 108a includes net negative fixed charges, while the FinFET 120b is a p-type FinFET with an n-type doped channel region and the liner film 108b includes net positive fixed charges. The liner film 108a has a sufficiently higher sheet charge carrier density than the liner film 108b. As a result, the liner films 108a and 108b considered as a whole still appear carrying net negative fixed charges in the sub-fin region of the FinFET 120a, which is still sufficiently high so as to repel the flowing of electrons into the sub-fin regions. To further this embodiment, the liner film 108a is an aluminum oxide ($AlO_x$) film and the liner film 108b is a silicon nitride ($SiN_x$)

film. Therefore, the bottom portion of the fin 104a is surrounded by an aluminum oxide film, a silicon nitride film, and the isolation structure 106, in a sequence away from the fin 104a. In other embodiments, the FinFET 120a is a p-type FinFET and the liner film 108a includes net positive fixed charges, while the FinFET 120b is an n-type FinFET and the liner film 108b includes net negative fixed charges. In such scenario, the dielectric layer 108a has a sufficiently higher sheet charge carrier density than the dielectric layer 108b to allow the dielectric layers 108a and 108b considered as a whole still appear carrying net positive fixed charges in sub-fin regions of the FinFET 120a, so as to repel the flowing of holes into the sub-fin regions. In furtherance of other embodiments, the bottom portion of the fin 104a is surrounded by a silicon nitride film, an aluminum oxide film, and an STI feature, in a sequence away from the fin 104a.

As shown in FIG. 1C, the bottom portion of the fin 104a is surrounded by the liner films 108a and 108b, and a dielectric spacer layer 108c located between the liner films 108a and 108b. The liner film 108b includes net fixed charges opposite to the fixed charges in the liner film 108a. The dielectric spacer layer 108c itself does not have net fixed charges, considered as electric neutral. The dielectric spacer layer 108c functions as a spacer to enlarge the distance between the liner film 108b and the fin 104a, weakening the electric field strength inside the sub-fin regions of the fin 104a from the net fixed charges of the liner film 108b. Therefore, even the sheet charge carrier density of the liner film 108a may not be much higher than the liner film 108b, or even equivalent or slightly less, the combined electric fields inside the sub-fin regions of the fin 104a from the liner films 108a and 108b still appear as the same type as the stand-alone electric field from the liner film 108a, so as to repel the flowing of charges into the sub-fin regions. The dielectric spacer layer 108c is conformal to the liner film 108a and also refers to as the spacer film 108c. The spacer film 108c may include silicon oxynitride (SiON), silicon carbide nitride (SiCN), silicon oxide carbide nitride (SiOCN), or a combination thereof. The spacer film 108c may have a thickness of about 0.5 nm to about 2 nm. In some embodiments, with the extra thickness from the spacer film 108c, the stack of the liner film 108a and spacer film 108c is thicker than the liner film 108b. In the present embodiment, the FinFET 120a is an n-type FinFET and the liner film 108a includes net negative fixed charges, while the FinFET 120b is a p-type FinFET and the liner film 108b includes net positive fixed charges. To further this embodiment, the liner film 108a is an aluminum oxide film, the liner film 108b is a silicon nitride film, and the spacer film 108c is a silicon oxynitride film. Therefore, the bottom portion of the fin 104a is surrounded by an aluminum oxide film, a silicon oxynitride film, a silicon nitride film, and the isolation structure 106, in a sequence away from the fin 104a. In other embodiments, the FinFET 120a is a p-type FinFET and the liner film 108a includes net positive fixed charges, while the FinFET 120b is an n-type FinFET and the liner film 108b includes net negative fixed charges. In furtherance of other embodiments, the bottom portion of the fin 104a is surrounded by a silicon nitride film, a silicon oxynitride film, an aluminum oxide film, and an STI feature, in a sequence away from the fin 104a.

In various embodiments of devices 100a, 100b, 100c, and 100d, the fins 104a and 104b are substantially free of the dopant impurities. As a result, the carrier mobility and the proper channel stress (either compressive or tensile) in the respective fin portions are advantageously maintained. This greatly enhances the electrical performance of the FinFETs 120a and 120b. A method of forming the device 100 will now be described below with reference to FIG. 2, in conjunction with FIGS. 3A-3H that illustrate cross-sectional views of the semiconductor device 100 at various stages of the manufacturing.

Figure 2:
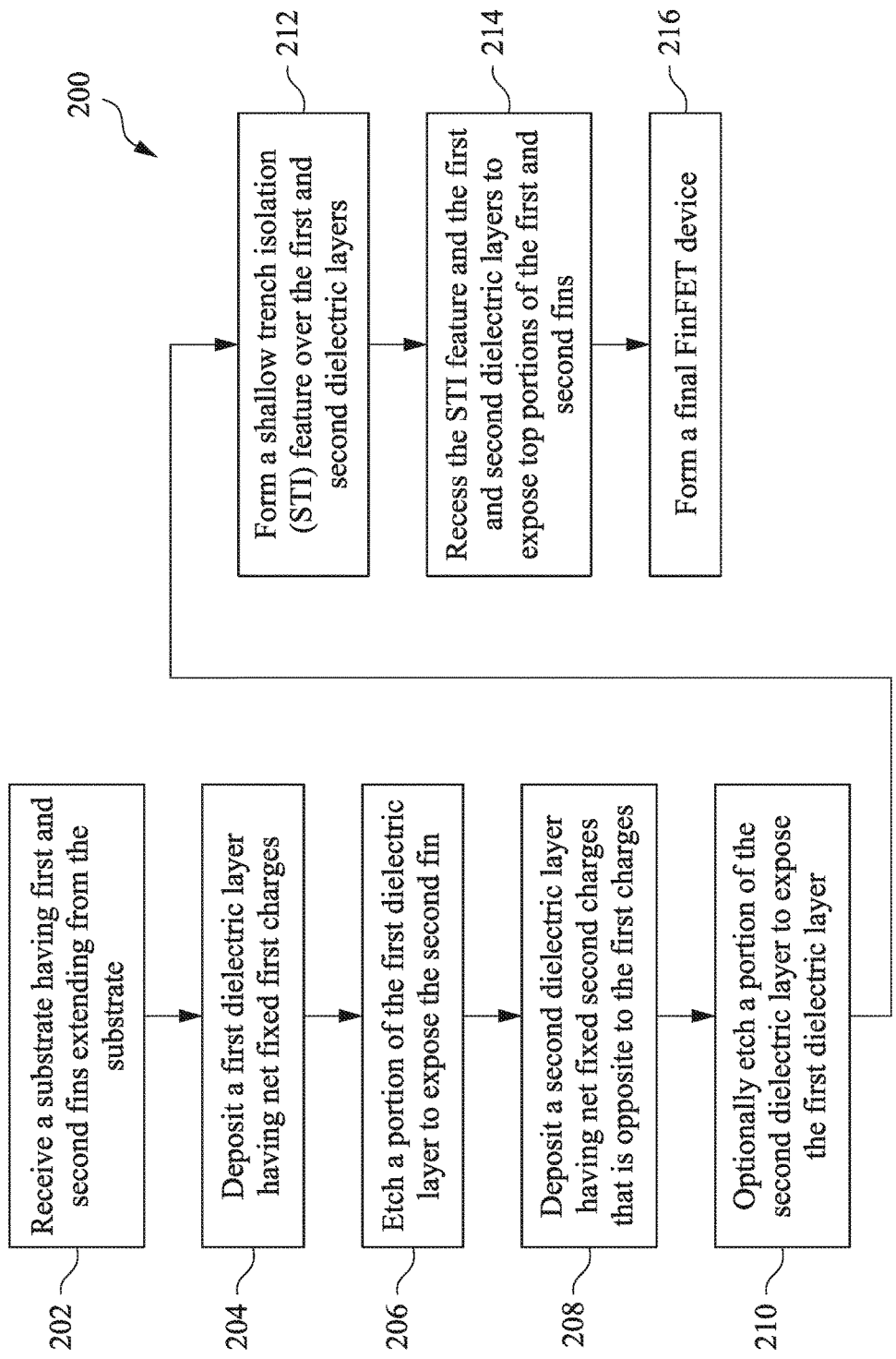
FIG. 2 shows a flow chart of a method of fabricating semiconductor devices, according to various aspects of the present disclosure.

Referring now to FIG. 2, a flowchart of a method 200 is illustrated according to various aspects of the present disclosure in forming a semiconductor device, such as the semiconductor device 100 of FIGS. 1A and 1B. The method 200 is merely an example, and is not intended to limit the present disclosure beyond what is explicitly recited in the claims. Additional operations can be provided before, during, and after the method 200, and some operations described can be replaced, eliminated, or moved around for additional embodiments of the method.

Figure 3A:
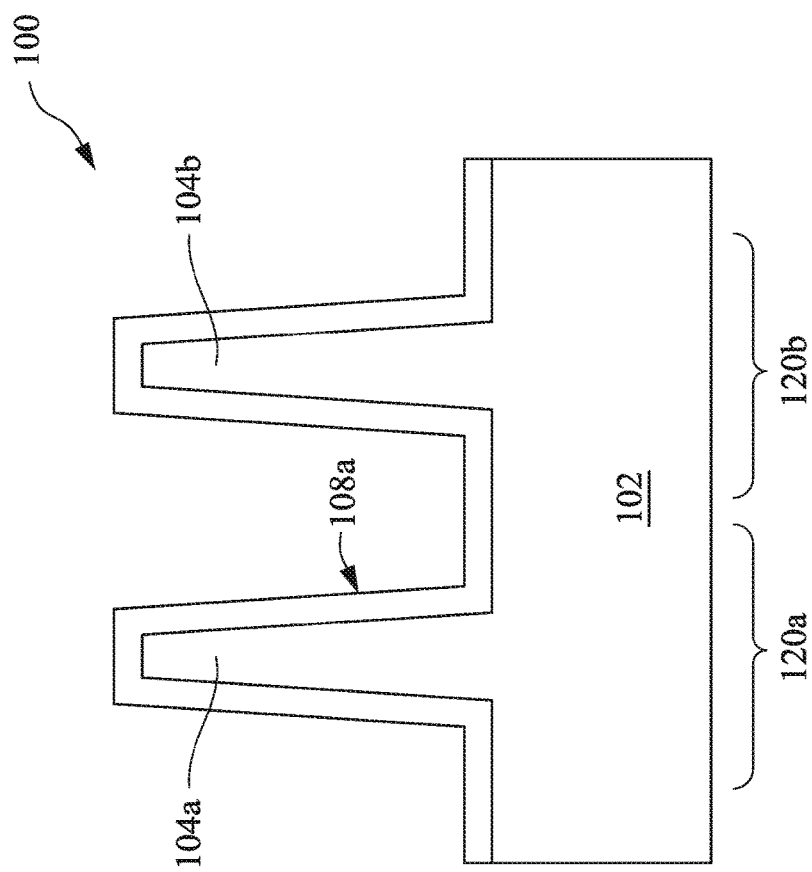

At operation 202, the method 200 (FIG. 2) receives a substrate 102 with various structures formed therein and/or thereon. Referring to FIG. 3A, the device 100 includes a substrate 102 having two fins 104a and 104b projecting upwardly from the substrate 102. The two fins 104a and 104b are in two regions of the device 100 where two FinFETs 120a and 120b are going to form. In an embodiment, the two fins 104a and 104b are fabricated using suitable processes including photolithography and etching processes. The photolithography process may include forming a photoresist (or resist) layer overlying the substrate 102, exposing the resist to a pattern, performing post-exposure bake processes, and developing the resist to form a resist pattern. The resist pattern is then used for etching a hard mask layer to form patterned hard masks. Subsequently, the substrate 102 is etched using the patterned hard masks as an etch mask, leaving the fins 104a and 104b on the substrate 102. The fins 104a and 104b can also be fabricated by advanced pitch-splitting techniques such as side-wall image transfer or double sidewall image transfer to achieve high pattern density. The various etching processes can include dry etching, wet etching, reactive ion etching (RIE), and/or other suitable processes.

At operation 204, the method 200 (FIG. 2) forms a dielectric layer (or liner film) 108a having net fixed charges. Still referring to FIG. 3A, the liner film 108a is conformally deposited on the device 100 as a blanket material layer, overlying the top surface of the substrate 102, and the sidewalls and the top surfaces of the fins 104a and 104b. In an embodiment, the FinFET 120a is a p-type FinFET and the liner film 108a includes net positive fixed charges. In the present embodiment, the FinFET 120a is an n-type FinFET and the liner film 108a is an aluminum oxide layer containing negative fixed charges. In one embodiment, the aluminum oxide layer is deposited using atomic layer deposition (ALD), chemical vapor deposition (CVD) or other suitable methods and may have a thickness about few nanometers (e.g., ranging from about 1 nm to about 5 nm). In an example of employing ALD method, trimethylaluminum ($Al(CH_3)_3$) was used as the aluminum precursor in the first half cycle of the ALD process. During the second half cycle, either $H_2O$ or $O_2$ plasma was used. The films were deposited using substrate temperatures ranging from about 50 degree Celsius to about 400 degree Celsius under operating pressure from about 100 mTorr to about 300 mTorr. In another embodiment, aluminum oxide layer is deposited by a plasma-enhanced chemical vapor deposition (PECVD) process. The PECVD process employed a continuous $O_2$/Ar plasma and trimethylaluminum as the aluminum precursor using deposition temperature ranging from about 50 degree Celsius to about 300 degree Celsius. Unlike ALD method, the deposition rate for PECVD scales with the trimethylaluminum flow introduced into the reactor. An annealing may follow the PECVD process, for example, in $N_2$ for 10 minutes at about 400 degree Celsius.

During the deposition of the aluminum oxide layer, ionized point defects in the aluminum oxide bulk provide the negatively charged traps. Aluminum and oxygen vacancies, interstitials, and dangling bonds introduce acceptor-like defect levels. Defects can trap electrons in deep acceptor-like levels near the $AlO_x$ valence band and thus act as fixed negative charge centers. In addition, the negatively charged tetrahedral $AlO_4$ may also have contribution to fixed negative charges. Deposition conditions and film thickness are designed and tuned to achieve expected sheet charge carrier density. In some embodiments, the liner film 108a has a sheet charge carrier density of about $2\times10^{11}/cm^2$ to $1\times10^{13}/cm^2$. In various embodiments, the liner film 108a has a thickness of about 1 nm to about 5 nm.

Figure 3B:
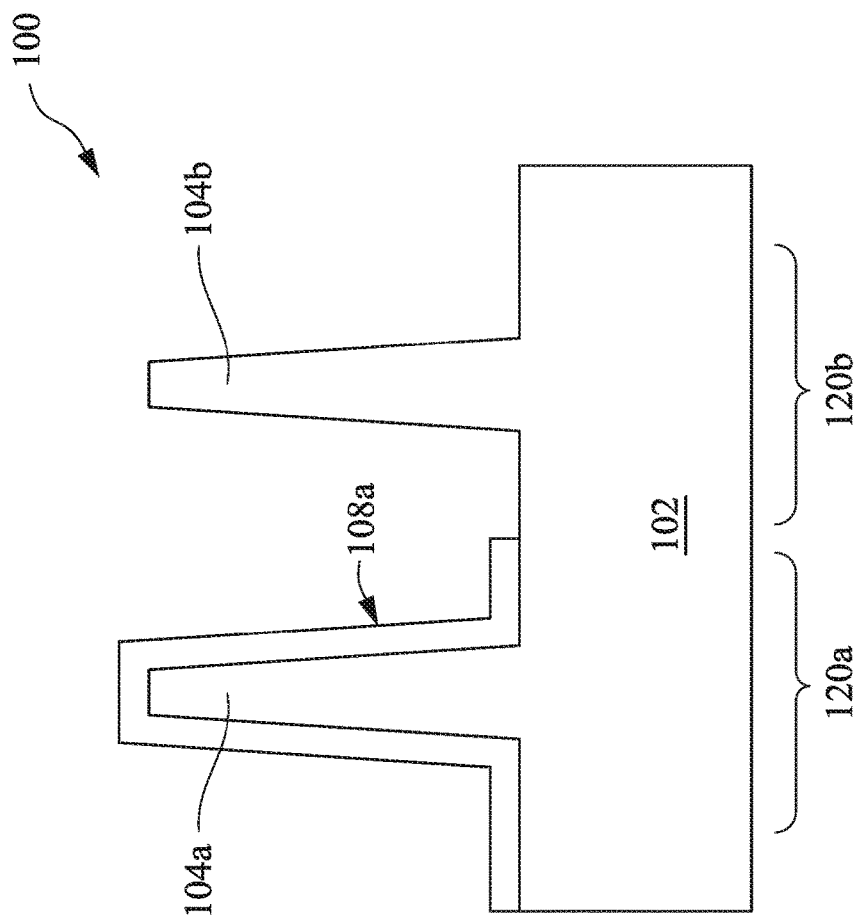

At operation 206, the method 200 (FIG. 2) removes a portion of the liner film 108a to expose the fin 104b (FIG. 3B). In some embodiments, after the blanket material layer 108a is formed, an etching process is performed to partially remove the blanket material from the sidewalls and top surface of the fin 104b. The blanket material covers the fin 104a substantially remains. The liner film 108a exhibits etch selectivity to the fin 104b due to the different material composition. In embodiments, the operation 206 uses an etching process with an etchant to selectively remove the liner film 108a while without substantially etching the fin 104b. The etching processes may include one or more dry etching processes, wet etching processes, and other suitable etching techniques.

Figure 3C:
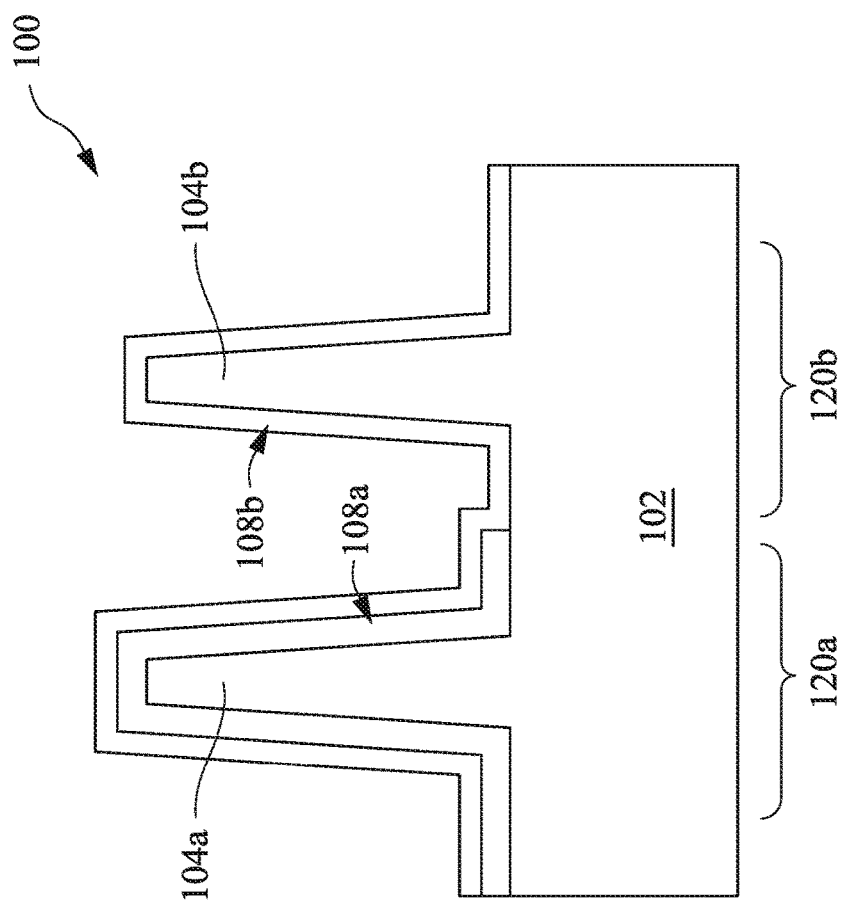

At operation 208, the method 200 (FIG. 2) forms a dielectric layer 104b having net fix charges opposite to the fix charges in the dielectric layer 108a. Referring to FIG. 3C, the liner film 108b is conformally deposited on the device 100 as a blanket material layer, overlying the liner film 108a in the FinFET 120a region, and sidewalls and top surface of the fin 104b in the FinFET 120b region. In an embodiment, the FinFET 120b is an n-type FinFET and the liner film 109b includes net negative fixed charges. In the present embodiment, the FinFET 120b is a p-type FinFET and the liner film 108b is a silicon nitride layer containing positive fixed charges. For example, the silicon nitride layer may be deposited using atmospheric pressure chemical vapor deposition (APCVD), PECVD, ALD, or other suitable methods, and may have a thickness about few nanometers (e.g., ranging from about 1 nm to about 5 nm). In one embodiment, the silicon nitride layer is deposited by a PECVD process. The deposition power is in a range of about 5 W to about 30 W, temperature in a range of about 300 degree Celsius to 900 degree Celsius, under pressure in a range of about 500 mTorr to 1200 mTorr. Silane ($SiH_4$, 10% in Ar) and ammonia ($NH_3$) were used as the process gasses and the ratio of gasses can be adjusted as a process parameter to tune net positive fixed charge concentration. In an example, $NH_3/SiH_4$ gas flow rate are in a range of about 30/300 sccm to about 100/30 sccm. In another embodiment, the silicon nitride layer is deposited by an ALD process using chlorosilane as the silicon source and ammonia as the nitrogen source. The deposition temperature is within a range from about 300 degree Celsius to about 600 degree Celsius. The fixed positive charges arise from silicon dangling bond with three nitrogen atoms (+Si≡N) within the silicon nitride, also known as K+ centers. In some embodiments, the liner film 108b has a sheet charge carrier density of about $2\times10^{11}/cm^2$ to $1\times10^{13}/cm^2$. Deposition conditions discussed above and post deposition treatments can adjust the sheet charge carrier density.

Figure 3D:
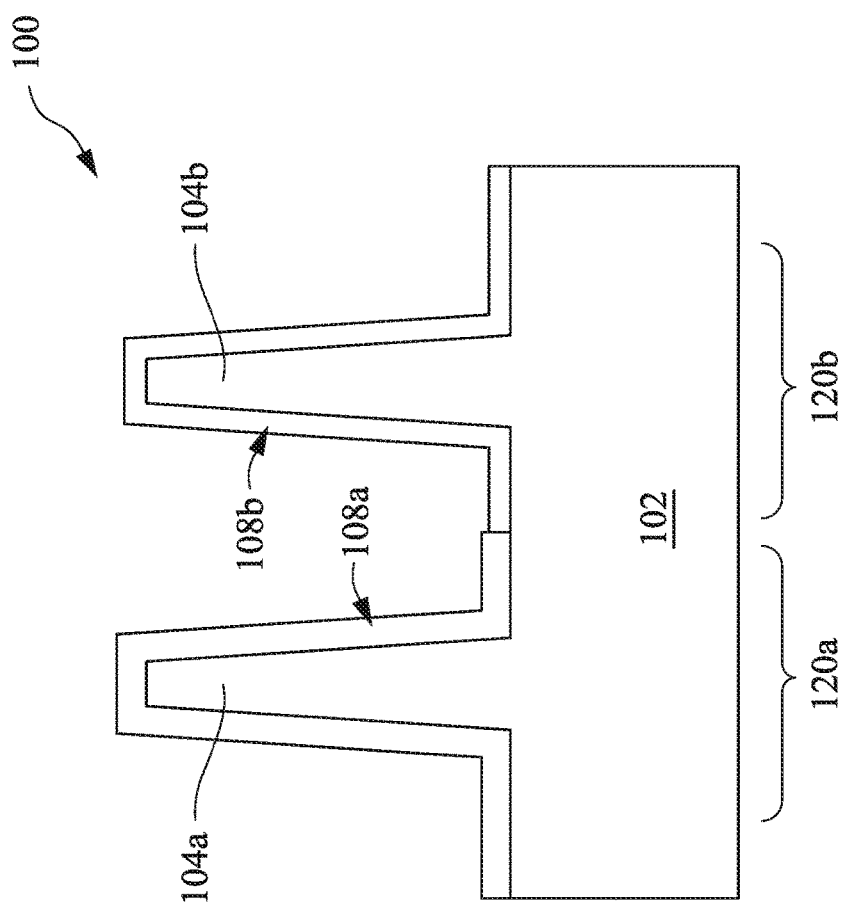

At operation 210, the method 200 (FIG. 2) removes a portion of the liner film 108b to expose the liner film 108a (FIG. 3D). The liner film 108a exhibits etch selectivity to the liner film 108b due to the different material composition. In embodiments, the operation 210 uses an etching process with an etchant to selectively remove the liner film 108b while substantially remain the liner film 108a. The operation 210 may use a dry etching, a wet etching, or other suitable etching processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. The operation 210 is optional. In some embodiments, even though the charges in the two different layers 108a and 108b are opposite, when the liner film 108a has a higher sheet charge carrier density than the liner film 108b, the net fixed charges on sidewalls of the fin 104a still appear as the same conductivity type as the liner film 108a. If the net fixed charge density is sufficiently high so as to repel the flowing of charges into the sub-fin regions, the operation 210 may be skipped, thereby the method 200 may optionally proceeds to operation 212 from operation 208.

At operation 212, the method 200 (FIG. 2) form an isolation feature 106 covering the device 100. For the sake of clarity, the device 100 after the operation 210 is denoted as the device 100a (FIG. 3E), and the device 100 skipped the operation 210 is denoted as the device 100b (FIG. 3F). The isolation feature 106 may be formed by depositing oxide compound, fluoride-doped silicate glass (FSG), a low-k dielectric material, and/or other suitable insulating material. The isolation structure 106 may be shallow trench isolation (STI) features. After the deposition of the isolation material, a polishing operation such as a chemical mechanical planarization (CMP) process is performed to remove excessive portion of the isolation feature 106, planarizing the top surface of the device 100.

At operation 214, the method 200 (FIG. 2) recesses the isolation feature 106 and liner films 108a and 108b to expose top portions of the fins 104a and 104b, as shown in FIGS. 3G and 3H. As a result of the operation 214, top portions of fins 104a and 104b project above the isolation feature 106, while bottom portions of fins 104a and 104b are still surrounded by the charged liner films 108a and 108b and the isolation feature 106. The isolation feature 106 and liner films 108a and 108b can be recessed by etching in either a single step or in separate etching steps, depending on the composition of the isolation feature and the liner films. Any suitable etching technique may be used to recess the isolation feature 106 and liner films 108a and 108b, including dry etching, wet etching, RIE, and/or other etching methods. Various etching parameters can be tuned for selective etching, such as etchant composition, etching temperature, etching solution concentration, etching time, etching pressure, source power, RF bias voltage, RF bias power, etchant flow rate, other suitable etching parameters, or combinations thereof.

At operation 216, the method 200 (FIG. 2) performs further processes to complete the fabrication of the FinFETs 120a and 120b. In an embodiment, operation 216 forms the gate structures 110a and 110b (FIGS. 1A and 1B) using either a "gate-first" or a "gate-last" process. Further, operation 216 may form epitaxial source/drain features in the source/drain regions and may form an inter-layer dielectric (ILD) layer over the isolation structure 106, the fins 104a and 104b, and the gate structures 110a and 110b. Further, operation 216 may form various conductive features, such as contacts, vias, and interconnects, so as to connect the FinFETs 120a and 120b to other portions of the device 100 to form a complete integrated circuit.

Figure 4:
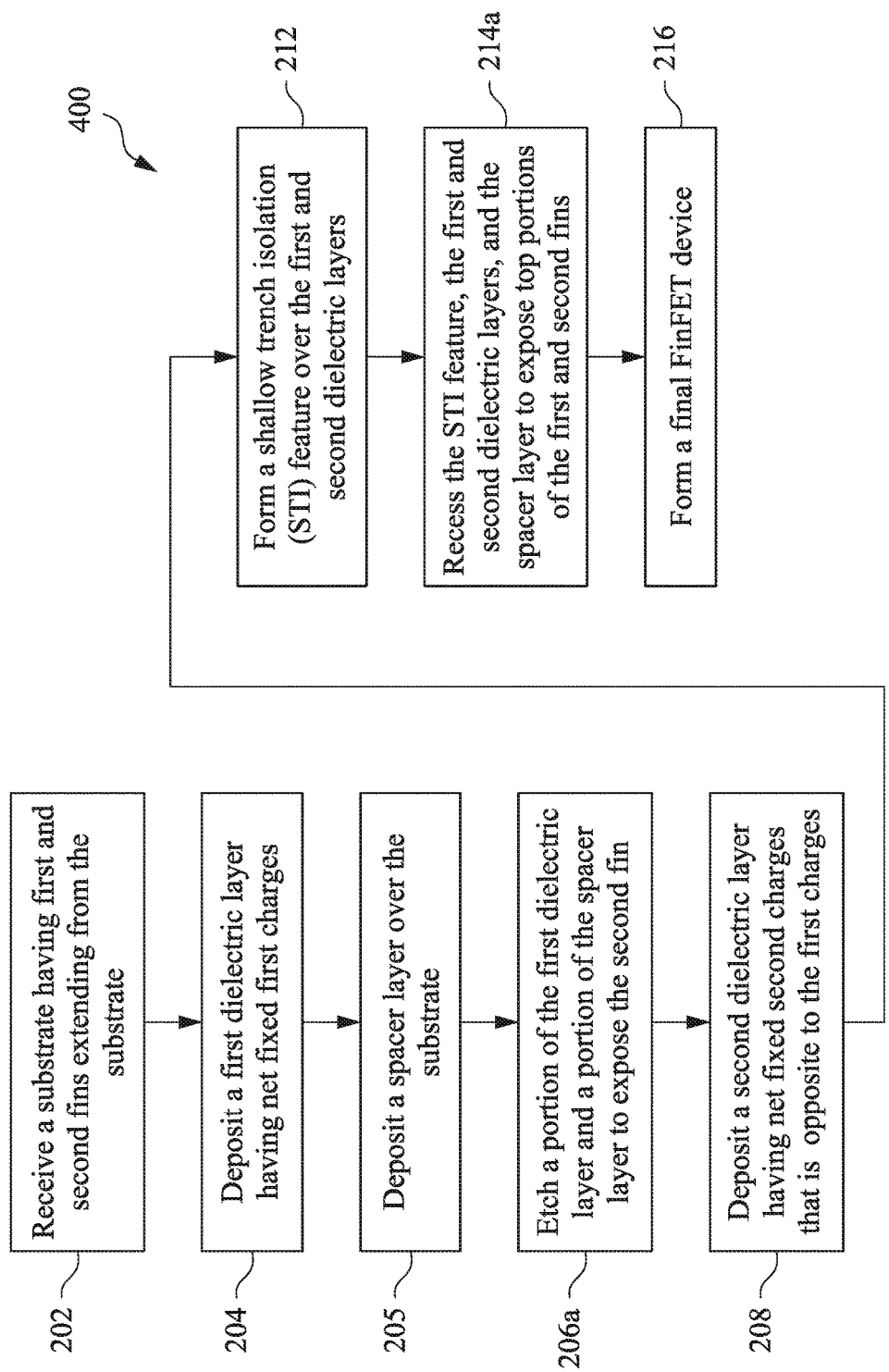
FIG. 4 shows a flow chart of another method of fabricating a semiconductor device, according to various aspects of the present disclosure.

FIG. 4 shows a flow chart of another method 400 according to various aspects of the present disclosure in forming a semiconductor device, such as the semiconductor device 100 depicted in FIG. 1C. The method 400 is similar to the method 200 in various operations. Therefore, reference numerals for the operations in the method 200 are repeated to show the same or similar operations in the device 400, such as operations 202, 204, 208, 212, and 216. The method 400 is merely an example, and is not intended to limit the present disclosure beyond what is explicitly recited in the claims. Additional operations can be provided before, during, and after the method 400, and some operations described can be replaced, eliminated, or moved around for additional embodiments of the method. The method 400 is described below in conjunction with FIGS. 5A-5F that illustrate cross-sectional views of the semiconductor device 100 at various stages of the manufacturing. Furthermore, some descriptions of the operations in the method 400 are abbreviated or omitted by referring to the descriptions of the method 200 for the sake of simplicity.

Figure 5A:
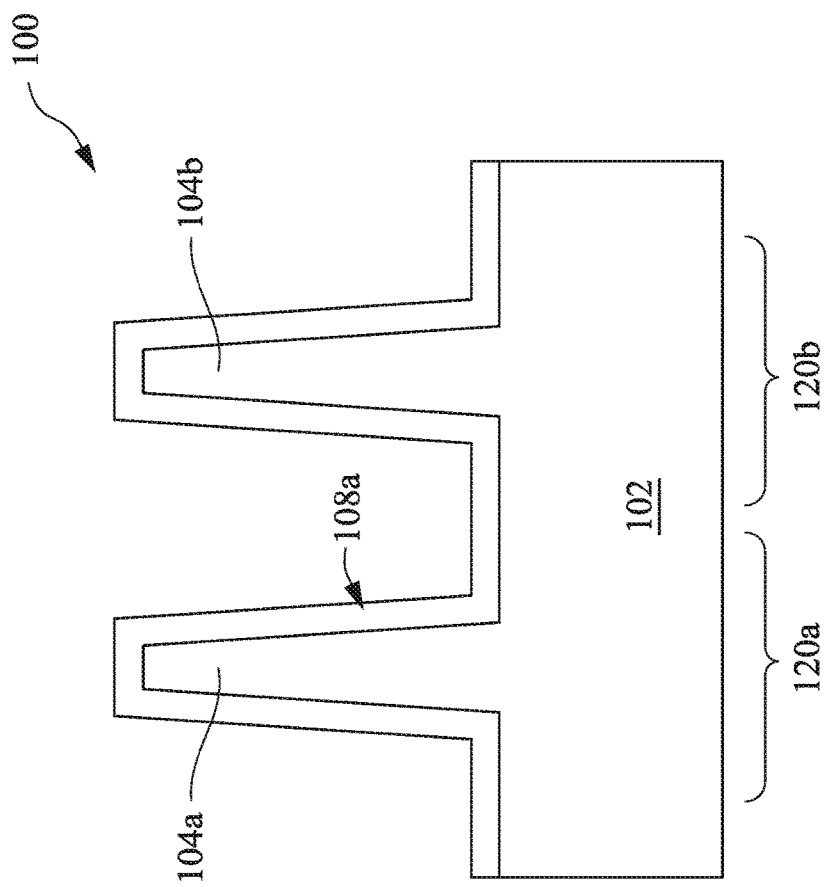
FIGS. 5A, 5B, 5C, 5D, 5E, and 5F are cross sectional views of forming a semiconductor device according to the method of FIG. 4, in accordance with some embodiments.

At operation 202, the method 400 (FIG. 4) receives the device 100. The device 100 includes a substrate 102 and two fins 104a and 104b. These features are the same or similar to those in FIG. 3A. At operation 204, the method 400 (FIG. 4) conformally forms a liner film 104a overlying the device 100, which has net fixed charges (FIG. 5A). Depending on the types of FinFET 120a to form, the liner film 104a can have positive fixed charges (e.g., a silicon nitride film) for a p-type FinFET or have negative fixed charges (e.g., an aluminum oxide film) for an n-type FinFET. In the present embodiment, FinFET 120a is an n-type FinFET and the liner film 108a can be formed by depositing aluminum oxide in a suitable process, such as ALD or PECVD. In various embodiments, the liner film 108a has a thickness of about 1 nm to about 5 nm.

Figure 5B:
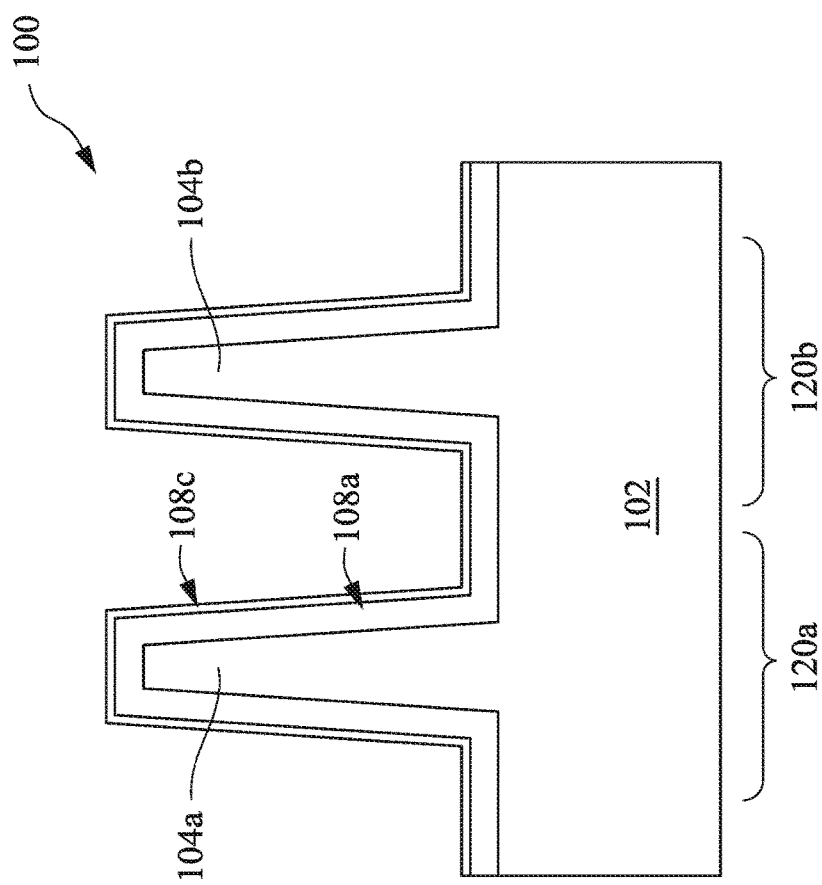

At operation 205, the method 400 (FIG. 4) deposits a dielectric spacer layer 108c conformally over the device 100 as a blanket material layer (FIG. 5B). The dielectric spacer layer 108c itself does not have net fixed charges, considered as electric neutral. The dielectric spacer layer 108c functions as a spacer to increase distance from the liner film 108b to be formed above to the sub-fin regions, thereby weakening the electric filed strength from the fixed charges in the liner film 108b. The dielectric spacer layer 108c also refers to as the spacer film 108c for simplicity. The spacer film 108c may include silicon oxynitride (SiON), silicon carbide nitride (SiCN), silicon oxide carbide nitride (SiOCN), or a combination thereof. The spacer film 108c may be formed by PECVD, ALD, or other suitable processes. The spacer film 108c may have a thickness of about 0.5 nm to about 2 nm.

Figure 5C:
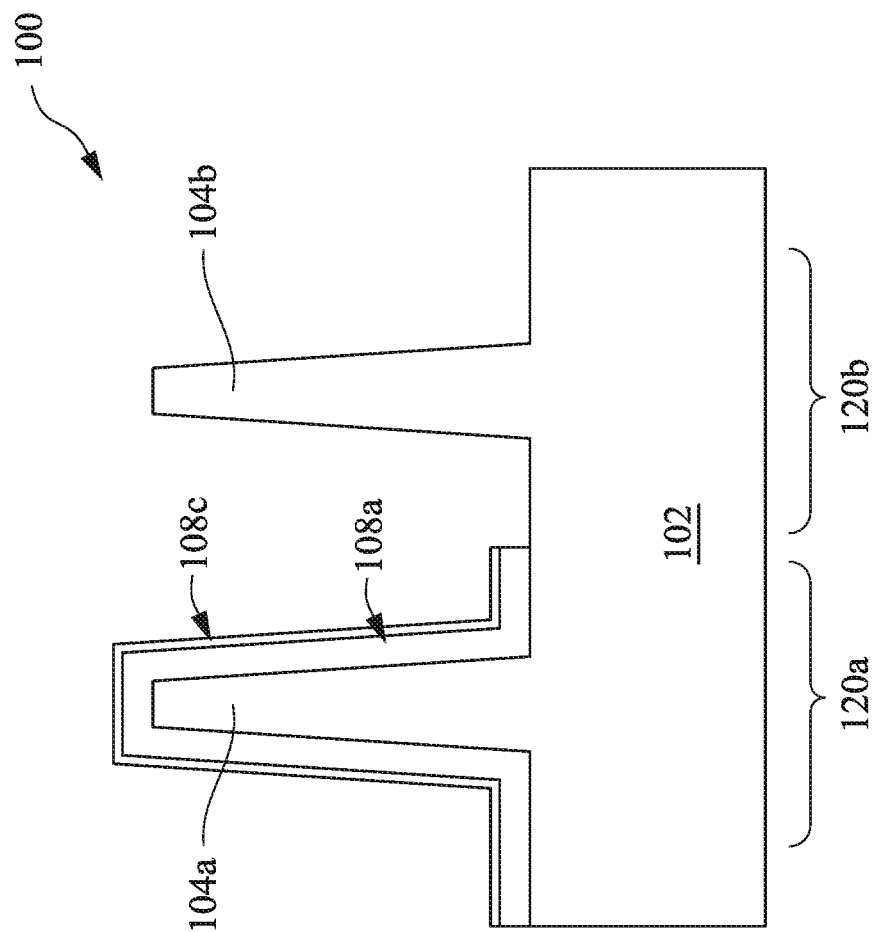

At operation 206a, the method 400 (FIG. 4) etch a portion of the liner film 108a and the spacer film 108c to expose the fin 104b (FIG. 5C). The etching processes may include one or more dry etching processes, wet etching processes, and other suitable etching techniques.

Figure 5D:
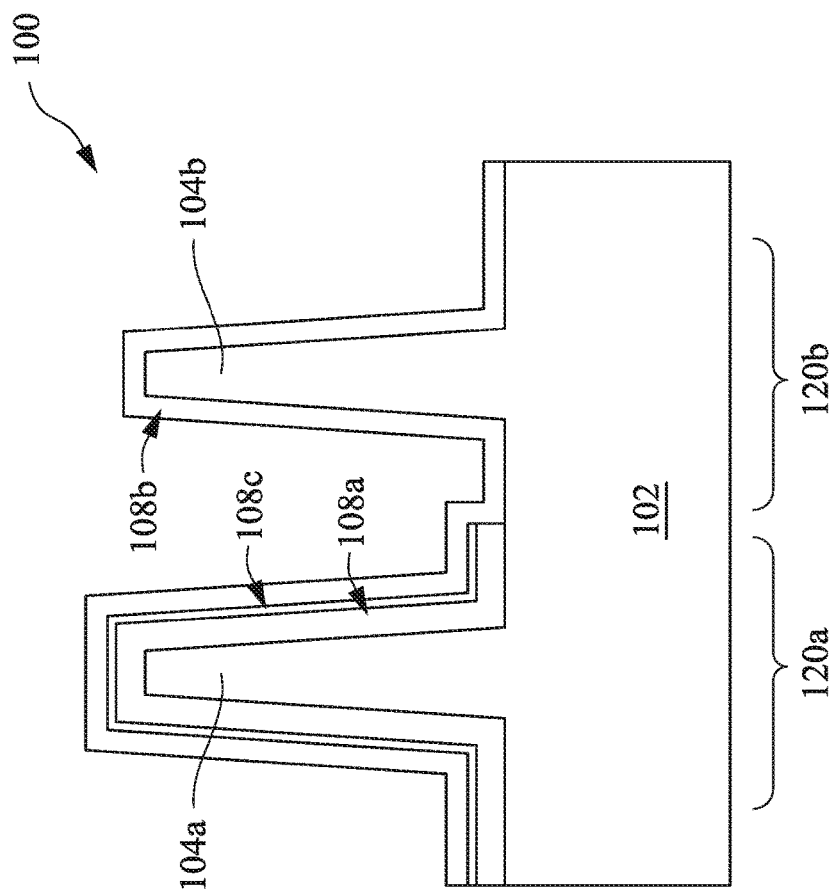

At operation 208, the method 400 (FIG. 4) forms a liner film 108b conformally overlying the device 100, which has net fix charges opposite to the fix charges in the dielectric layer 108a. As shown in FIG. 5D, the liner film 108b is deposited on the device 100 as a blanket material layer, covering the spacer film 108c and the fin 104b. In the present embodiment, the FinFET 120b is a p-type FinFET and the liner film 108b can be formed by depositing silicon nitride in a suitable process, such as ALD or PECVD. In various embodiments, the liner film 108b has a thickness of about 1 nm to about 5 nm. Even though the fixed charges in the two different liner films 108a and 108b are opposite, the spacer film 108c decreases the electric field strength in the fin 104a from the fixed charges in the liner film 108b, so as the combined electric fields inside the fin 104a still appear as the same type as the stand-alone electric field from the liner film 108a. In some embodiments, the liner film 108a has a higher sheet charge carrier density than the liner film 108b. In some embodiments, the liner film 108a can have an equivalent, or even slightly smaller, sheet charge carrier density than the liner film 108b, with the existence of the spacer film 108c.

In some embodiments, the FinFET 120a is a p-type FinFET and the FinFET 120b is an n-type FinFET. Accordingly, the liner films 108a and 108b includes net fixed positive charges and net fixed negative charges, respectively. In furtherance of embodiments, the liner film 108a includes silicon nitride and the liner film 108b includes aluminum oxide.

Figure 5E:
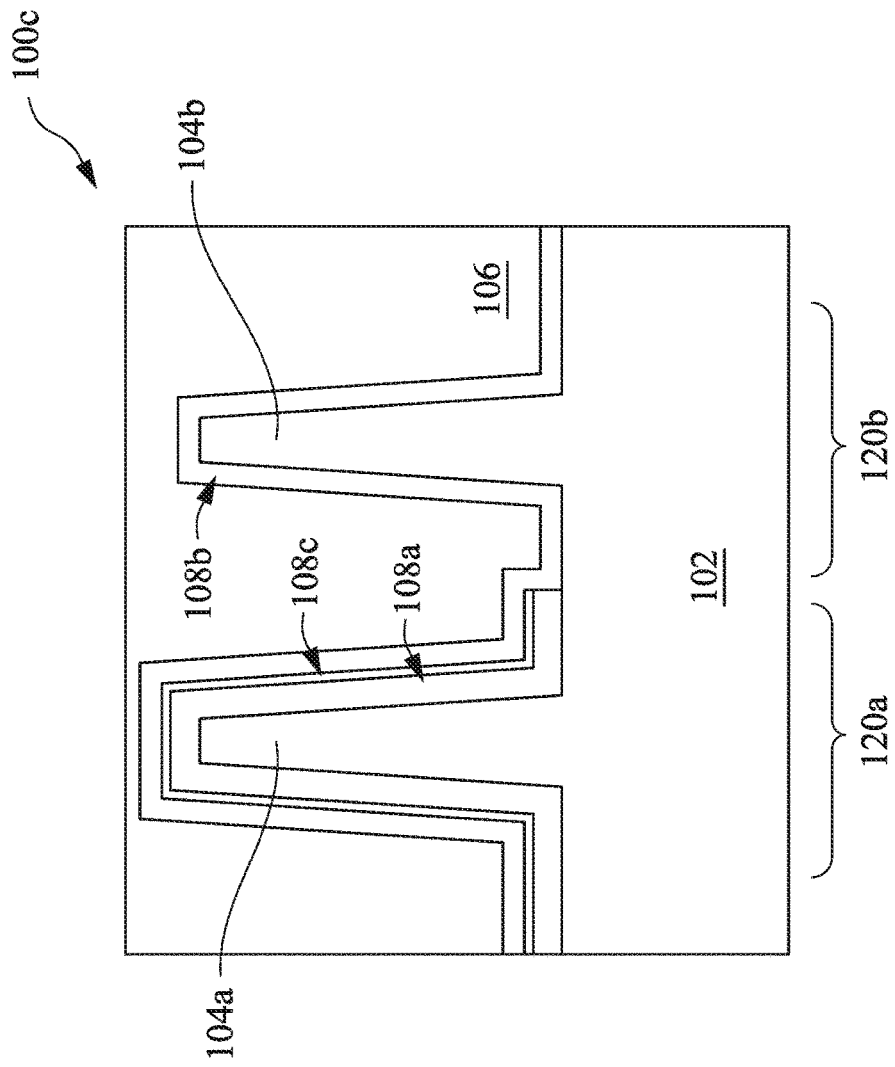
Figure 5F:
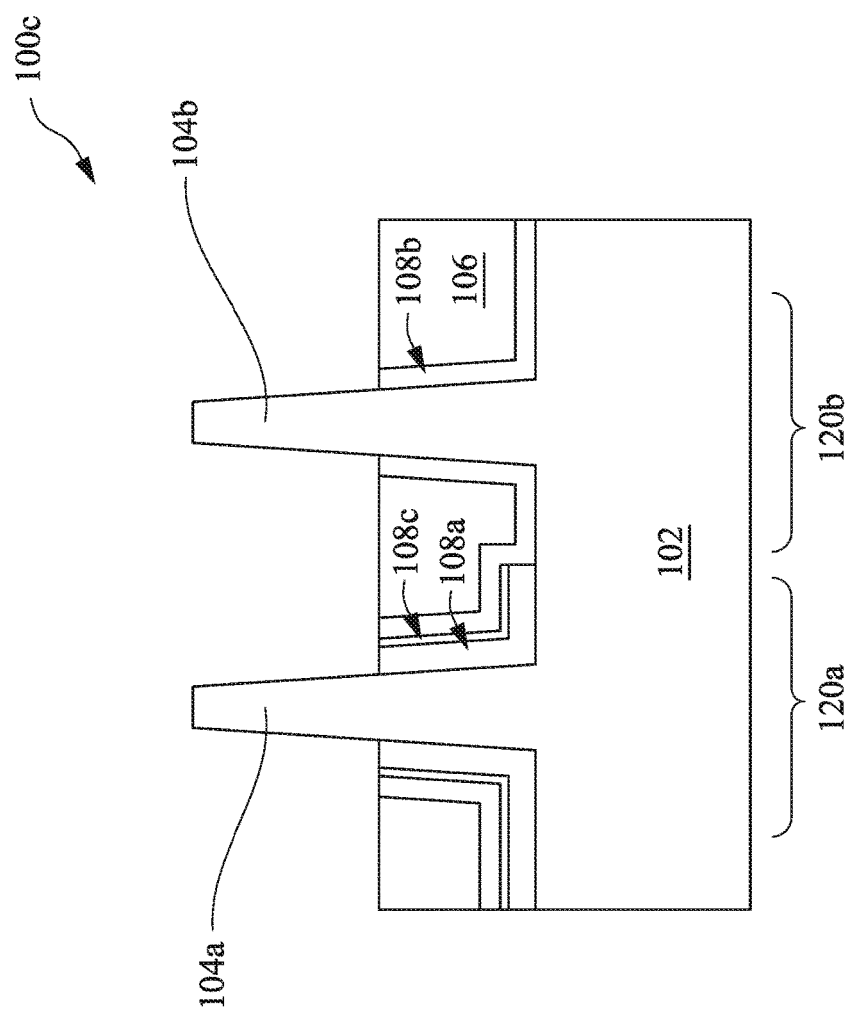

At operation 212, the method 400 (FIG. 4) form an isolation feature 106 covering the device 100. For the sake of clarity, the device 100 with the deposition of spacer film 108c is denoted as the device 100c (FIG. 5E). At operation 214a, the method 400 (FIG. 4) recesses the isolation feature 106, liner films 108a and 108b, and the spacer film 108c, to expose top portions of the fins 104a and 104b, as shown in FIG. 5F. At operation 216, the method 400 (FIG. 4) performs further processes to complete the fabrication of the FinFETs 120a and 120b for the device 100c.

Although not intended to be limiting, one or more embodiments of the present disclosure provide many benefits to a semiconductor device and the formation thereof. For example, embodiments of the present disclosure provide structures of and methods for bulk FinFETs having punch-through stoppers underneath channel fins. The punch-through stoppers are formed using fixed charges in dielectric liner films, which preserve purity in the channel fins. Specifically, negatively charged dielectric liner film is used in n-type FET to repel electrons from flowing in the sub-fin region, and positively charged dielectric liner film is used in p-type FET to repel holes from flowing in the sub-fin region. The fixed charge density in the dielectric liner films can be flexibly adjusted by tuning deposition conditions or conducting post deposition treatments. Various embodiments of the present disclosure can be implemented with low complexity and low manufacturing cost.

In one exemplary aspect, the present disclosure is directed to a method. The method includes receiving a semiconductor substrate and a fin extending from the semiconductor substrate; forming multiple dielectric layers conformally covering the fin, the multiple dielectric layers including a first charged dielectric layer having net fixed first-type charges and a second charged dielectric layer having net fixed second-type charges, the second-type charges being opposite to the first-type charges, the first-type charges having a first sheet density and the second-type charges having a second sheet density, the first charged dielectric layer being interposed between the fin and the second charged dielectric layer. The method further includes patterning the multiple dielectric layers, thereby exposing a first portion of the fin, wherein a second portion of the fin is surrounded by at least a portion of the first charged dielectric layer; and forming a gate structure engaging the first portion of the fin.

In another exemplary aspect, the present disclosure is directed to a method of forming a semiconductor device. The method includes receiving a substrate including first and second fins extending from the substrate; depositing a first dielectric layer containing net first-type charges, the first dielectric layer covering the first and second fins; and etching a portion of the first dielectric layer, thereby exposing the second fin. The method further includes depositing a second dielectric layer containing net second-type charges that are opposite to the net first-type charges, the second dielectric layer covering the second fin; forming an isolation feature covering the first and second dielectric layers; and recessing the isolation feature and the first and second dielectric layers, thereby uncovering a first portion of the first fin and a first portion of the second fin.

In another exemplary aspect, the present disclosure is directed to a semiconductor device. The semiconductor device includes a substrate; an isolation structure over the substrate; a first fin extending from the substrate, wherein a first portion of the first fin is above the isolation structure and a second portion of the first fin is surrounded by the isolation structure; and a first dielectric layer between the isolation structure and the second portion of the first fin, wherein the first dielectric layer contains fixed first-type charges. The semiconductor device further includes a second fin extending from the substrate, wherein a first portion of the second fin is above the isolation structure and a second portion of the second fin is surrounded by the isolation structure; and a second dielectric layer between the isolation structure and the second portion of the second fin, wherein the second dielectric layer contains fixed second-type charges, wherein the first-type charges are opposite to the second-type charges.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a semiconductor substrate;
   a fin extending from the semiconductor substrate;
   a first charged dielectric layer covering a bottom portion of the fin, the first charged dielectric layer having net fixed first-type charges;
   a second charged dielectric layer covering the first charged dielectric layer, the second charged dielectric layer having net fixed second-type charges, the second-type charges being opposite to the first-type charges;
   a spacer layer conformal to the fin, the spacer layer being interposed between the first charged dielectric layer and the second charged dielectric layer, the spacer layer being electric neutral; and
   a gate structure engaging a top portion of the fin.

2. The semiconductor device of claim 1, wherein the first charged dielectric layer and the second charged dielectric layer are both conformal to the fin.

3. The semiconductor device of claim 1, wherein the spacer layer contains a composition selected from silicon oxynitride, silicon carbide nitride, silicon oxide carbide nitride, and a combination thereof.

4. The semiconductor device of claim 1, wherein the first-type charges has a first sheet density and the second-type charges has a second sheet density, the first sheet density being higher than the second sheet density.

5. The semiconductor device of claim 4, wherein:
   the first sheet density is within a range of $2 \times 10^{11}/cm^2$ to $1 \times 10^{13}/cm^2$; and
   the second sheet density is within a range of $2 \times 10^{11}/cm^2$ to $1 \times 10^{13}/cm^2$.

6. The semiconductor device of claim 1, wherein:
   the top portion of the fin provides a channel for an n-type field effect transistor;
   the first-type charges are negative charges; and
   the second-type charges are positive charges.

7. The semiconductor device of claim 6, wherein the first charged dielectric layer contains aluminum oxide and the second charged dielectric layer contains silicon nitride.

8. The semiconductor device of claim 1, further comprising:
   an isolation feature covering and in direct contact with the second charged dielectric layer.

9. The semiconductor device of claim 8, wherein the isolation feature is a shallow trench isolation (STI) feature.

10. A semiconductor device, comprising:
    a semiconductor substrate having a first region and a second region;
    a first fin extending from the semiconductor substrate within the first region;
    a first dielectric layer surrounding a bottom portion of the first fin, the first dielectric layer being within the first region;
    a second fin extending from the semiconductor substrate within the second region;
    a second dielectric layer surrounding a bottom portion of the second fin, a portion of the second dielectric layer extending into the first region and covering at least a portion of the first dielectric layer; and
    a spacer layer within the first region, the spacer layer being interposed between the first dielectric layer and the portion of the second dielectric layer extending into the first region, wherein the spacer layer is electric neutral, and
    wherein the first dielectric layer contains fixed first-type charges and the second dielectric layer contains fixed second-type charges opposite to the first-type charges.

11. The semiconductor device of claim 10, wherein the first dielectric layer has a thickness larger than the second dielectric layer.

12. The semiconductor device of claim 10, wherein the first dielectric layer has a sheet charge carrier density higher than the second dielectric layer.

13. The semiconductor device of claim 10, wherein the fixed first-type charges are fixed negative charges and the fixed second-type charges are fixed positive charges.

14. The semiconductor device of claim 10, wherein the first dielectric layer includes aluminum oxide and the second dielectric layer includes silicon nitride.

15. A semiconductor device, comprising:
- a substrate;
- an isolation structure over the substrate;
- a first fin extending from the substrate, wherein a first portion of the first fin is above the isolation structure and a second portion of the first fin is surrounded by the isolation structure;
- a first dielectric layer between the isolation structure and the second portion of the first fin, wherein the first dielectric layer contains fixed first-type charges;
- a second fin extending from the substrate, wherein a first portion of the second fin is above the isolation structure and a second portion of the second fin is surrounded by the isolation structure; and
- a second dielectric layer between the isolation structure and the second portion of the second fin, wherein the second dielectric layer contains fixed second-type charges, wherein the first-type charges are opposite to the second-type charges, and
- wherein the first portion of the first fin includes a p-type doped channel for an n-type field effect transistor and the first-type charges are negative charges, and wherein the first portion of the second fin includes an n-type doped channel for a p-type field effect transistor and the second-type charges are positive charges.

16. The semiconductor device of claim 15, wherein:
the first dielectric layer contains aluminum oxide; and
the second dielectric layer contains silicon nitride.

17. The semiconductor device of claim 15, wherein:
the first dielectric layer has a sheet charge carrier density within a range of $2\times10^{11}/cm^2$ to $1\times10^{13}/cm^2$; and
the second dielectric layer has a sheet charge carrier density within a range of $2\times10^{11}/cm^2$ to $1\times10^{13}/cm^2$.

18. The semiconductor device of claim 15, wherein the isolation structure is a shallow trench isolation (STI) feature.

19. The semiconductor device of claim 15, wherein the second dielectric layer extends to the first dielectric layer such that the second dielectric layer covers a top surface of the first dielectric layer, the top surface of the dielectric layer facing away from the substrate.

20. The semiconductor device of claim 19, further comprising a spacer layer interposed between the first dielectric layer and the second dielectric layer, the spacer layer being electric neutral.

* * * * *